(12) United States Patent
Den Ouden

(10) Patent No.: US 7,196,409 B2
(45) Date of Patent: Mar. 27, 2007

(54) SEMICONDUCTOR DEVICE, SEMICONDUCTOR BODY AND METHOD OF MANUFACTURING THEREOF

(75) Inventor: Josephus Adrianus Augustinus Den Ouden, Culemborg (NL)

(73) Assignee: NXP B.V., Eindhoven (NL)

( * ) Notice: Subject to any disclaimer, the term of this patent is extended or adjusted under 35 U.S.C. 154(b) by 66 days.

(21) Appl. No.: 10/548,297

(22) PCT Filed: Feb. 27, 2004

(86) PCT No.: PCT/IB2004/050161

§ 371 (c)(1),
(2), (4) Date: Sep. 6, 2005

(87) PCT Pub. No.: WO2004/079822

PCT Pub. Date: Sep. 16, 2004

(65) Prior Publication Data

US 2006/0202327 A1    Sep. 14, 2006

(30) Foreign Application Priority Data

Mar. 7, 2003    (EP)    ................... 03100568

(51) Int. Cl.
*H01L 21/44*    (2006.01)
*H01L 23/48*    (2006.01)

(52) U.S. Cl. ...................... 257/690; 257/698; 257/773; 257/784; 257/E23.01; 438/111; 438/123

(58) Field of Classification Search ................ 438/107, 438/110, 111, 118, 123; 257/666, 690, 962, 257/698, 773–776, 784

See application file for complete search history.

(56) References Cited

U.S. PATENT DOCUMENTS 5,714,405 A * 2/1998 Tsubosaki et al. .......... 438/118

(Continued)

FOREIGN PATENT DOCUMENTS

JP    08 255810    10/1996

*Primary Examiner*—Kevin M. Picardat
(74) *Attorney, Agent, or Firm*—Peter Zawilski

(57) ABSTRACT

The invention relates to a semiconductor device (10) comprising a semiconductor body (11) in which an IC is formed and which has a number of connection regions (1) for the IC on its surface, including at least two connection regions (1A) for a supply connection, the lower side of the semiconductor body (11) being provided with a number of further connection regions (2) which are connected to a connection region (1) by means of an electric connection (3) which is present on a side face of the semiconductor body (11) and electrically insulated therefrom, and the semiconductor body (11) being attached to a lead frame (4) and wire connections (5) being formed between leads (4A) of the frame (4) and connection regions (1). According to the invention, the electric connection (3) comprises a plurality of parallel, regularly spaced strip-shaped conductors (3A), and the connection regions (1A) for the supply connection are each connected with a further connection region (2) by means of two or more of said strip-shaped conductors (3A), which further connection region is directly connected to a lead (4B) of the frame (4), while the remainder of the connection regions (1B) are directly connected with leads (4) by means of the wire connections (5). Such a device (10) has a very stable supply voltage and excellent high-frequency behavior, while the supply current may be extremely high. The invention further comprises a semiconductor body (11) suitable for use in such a device (10) and a method of manufacturing such a device (10).

13 Claims, 2 Drawing Sheets

U.S. PATENT DOCUMENTS

| | | | |
|---|---|---|---|
| 5,818,107 A * | 10/1998 | Pierson et al. | 257/723 |
| 6,346,432 B2 * | 2/2002 | Sugimura | 438/113 |
| 6,358,772 B2 * | 3/2002 | Miyoshi | 438/106 |
| 6,709,895 B1 * | 3/2004 | Distefano | 438/115 |
| 6,984,885 B1 * | 1/2006 | Harada et al. | 257/696 |

* cited by examiner

SEMICONDUCTOR DEVICE, SEMICONDUCTOR BODY AND METHOD OF MANUFACTURING THEREOF

The invention relates to a semiconductor device comprising a semiconductor body having a substrate and a semiconductor region, which semiconductor body accommodates a plurality of semiconductor elements in the form of an integrated circuit, and a surface of the semiconductor body is provided with a number of electric connections for the integrated circuit, including at least two for a supply connection, a side of the semiconductor body situated opposite the surface being provided with a number of further electric connection regions which are connected to an electric connection region on the surface of the semiconductor body by means of an electric connection which is situated on, and electrically insulated from, a side face of the semiconductor body that makes an angle with the surface, and the semiconductor body being attached to a lead frame and further electric connections being formed between connection conductors forming part of the lead frame and electric connection regions. Such a device, which is preferably provided with a synthetic resin encapsulation, constitutes an important electronic module. The invention also relates to a semiconductor body which can suitably be used in such a device, as well as to a method of manufacturing such a device.

A semiconductor device of the type mentioned in the opening paragraph is known from Japanese patent specification JP-A-08-255810, which was published under that number on 1 Oct. 1996. In said document (see FIG. 3) a connection conductor frame, commonly referred to as lead frame, is shown on which a semiconductor IC (=Integrated Circuit) is attached, in particular an IC with a very high integration density. On the upper side thereof connection regions are situated, two of which are used for a supply connection, and on the lower side thereof further connection regions are situated, which are interconnected by means of an electric connection extending over a side face of the IC. Wire connections are formed between the IC and the connection conductors forming part of the lead frame, i.e. the so-termed leads. With a view to a high integration, the wire connections on the IC (see FIG. 4) are situated only on the further connection conductors on the lower side of the IC or on the electric connection on a side face of the IC. By virtue thereof, the upper surface of the IC is entirely available for forming active semiconductor elements.

A drawback of the known device resides in that it is less suitable for future ICs which operate at an increasingly higher supply current and an increasingly higher frequency.

Therefore it is an object of the present invention to provide a semiconductor device of the type mentioned in the opening paragraph, which combines a high integration density with a low working voltage and an excellent high-frequency behavior.

To achieve this, a device of the type mentioned in the opening paragraph is characterized in that the electric connection comprises a plurality of regularly spaced, parallel strip-shaped conductors, and the electric connection regions for the supply connection are each connected by means of two or more of said strip-shaped conductors to a further electric connection region which is directly connected to a connection conductor which forms part of the lead frame, while the other electric connection regions are directly connected, by means of the further electric connections, to connection conductors forming part of the lead frame. The invention is based first of all on the recognition that the supply current in future ICs will increase substantially to values that lie even above 100A. The invention is further based on the recognition that an increasingly higher supply current makes it extremely difficult to stabilize the supply voltage on the semiconductor body. This problem increases as the supply voltage decreases, which is the current trend. The impedance of a wire connection to a connection region for the supply results in a DC (=Direct Current) deviation of the supply voltage. As a result, the IO (=Input Output) noise margins are reduced and additional power dissipation occurs. Oscillation of the supply voltage due to the still higher dynamic impedance causes a further reduction of the signal integrity. By connecting the supply connection via the side face of the IC to a further connection conductor on the lower side of the IC, a direct electric connection can readily be made between the connection region for the supply connection and a connection conductor that forms part of the lead frame. By virtue thereof, the (dynamic) impedance problems associated with a wire connection are precluded in a device in accordance with the invention. In addition, also the self-inductance of the supply connection is very low, so that an external AC (=Alternating Current) decoupling—by means of a capacitor connected to the IC—has a better effect on the supply of the IC.

The use of two or more, and preferably a plurality of, strip-shaped conductors on the side face of the IC to form a connection between the relevant connection region and the relevant further connection region, permits a very high supply current without the above-mentioned problems. Besides, an important additional and surprising advantage of such a "zebra" pattern of strip-shaped conductors on the side face of the IC resides in that a layout freedom is obtained regarding the position of the connection regions. After all, these can be positioned at any location, near the edge of the semiconductor body, and still make contact each time with a (large) number of strip-shaped conductors, and, without causing short-circuits, with the strip-shaped conductors which are, or will be, connected to a neighboring connection region. On the other hand, by virtue of this "zebra" pattern, it is precluded that too large a mechanical stress builds up in the electric connection as a result of the high currents passing through it and the associated heat dissipation.

In a preferred embodiment of a semiconductor device in accordance with the invention, this semiconductor device thus comprises a large number of electric connection regions for a supply connection, which each supply a part of a supply current to the integrated circuit, and are situated at the edge of the surface of the semiconductor body and are each connected, by means of a plurality of said strip-shaped conductors, to an individual further electric connection region. By a large number of electric connection regions is meant several hundreds of connection regions for a supply connection. In this respect, the following perception plays a role. If too large a number of semiconductor elements, such as MOS (=Metal Oxide Semiconductor) transistors of a CMOS IC, are connected to a single supply connection, the stability of the supply voltage of said transistors is influenced. Said stability can be substantially improved by each time reducing the number of transistors that are coupled to a separate supply connection or by providing heavier-duty connections for each one of the supplies.

Preferably, the above-mentioned supply connections, which may thus be situated everywhere/anywhere on the surface of the semiconductor body, are subsequently coupled in groups to a supply segment that is positioned at the edge of the semiconductor body. These electric connection regions for a supply connection are preferably elongated, the longest side extending parallel to and bordering directly on a side face of the semiconductor body.

Good results can be obtained if the strip-shaped conductors have a width in the range between 10 and 100 µm and are situated at a distance from each other in the range between 1 and 100 µm. The choice of the width of and the distance between the strip-shaped conductors is also determined by the technique used to form them. For this purpose, different approaches are possible, as will be discussed at a later stage.

In a further favorable embodiment the semiconductor body is encapsulated by a synthetic resin encapsulation from which laterally project the connection conductors of the lead frame which are provided with a wire connection, and on the lower side of which the further electric connection regions are electrically accessible. Said electric connection regions may be shaped so as to be suitable for the so-termed surface mounting technique. It is alternatively possible, however, that they advantageously take the form of pins that project from the encapsulation and are attached to and mounted on, for example, a PCB (=Printed Circuit Board) in a manner similar to the I/O (=Input/Output) signal pins that are situated at the edge of the IC.

The invention also comprises a semiconductor body which is suitable for use in a semiconductor device in accordance with the invention, and which has a substrate and a semiconductor region, and which semiconductor body accommodates a plurality of semiconductor elements in the form of an integrated circuit, and the surface of the semiconductor body is provided with a number of electric connection regions for the integrated circuit, including at least two for a supply connection, a side of the semiconductor body situated opposite the surface being provided with a number of further electric connection regions which are connected to an electric connection region on the surface of the semiconductor body by means of an electric connection which is situated on, and electrically insulated from, a side face of the semiconductor body that makes an angle with the surface, characterized in that the electric connection comprises a plurality of regularly spaced, parallel strip-shaped conductors, and the electric connection regions for the supply connection are each connected by means of two or more of said strip-shaped connectors to a further electric connection region.

Preferably, the semiconductor body comprises a large number of electric connection regions for a number of supply connections, which electric connection regions each provide a part of the integrated circuit with a supply current, are situated at the edge of the surface of the semiconductor body and are each connected, by means of a plurality of said strip-shaped conductors, to a separate further connection region. A large number of connections for a supply voltage of the IC in the semiconductor body are preferably coupled as a group to each time one of the electric connection regions for a supply connection, said connection regions being elongated, with the longest side extending parallel to the side face of the semiconductor body. Preferably, the strip-shaped conductors have a width between 10 and 100 µm and are situated at a distance from each other in the range between 1 and 100 µm.

The invention further relates to a method of manufacturing a semiconductor device comprising a semiconductor body having a substrate and a semiconductor region, which semiconductor body accommodates a plurality of semiconductor elements in the form of an integrated circuit, and the surface of the semiconductor body is provided with a number of electric connection regions for the integrated circuit, including at least one for a supply connection, a side of the semiconductor body situated opposite the surface being provided with a number of further electric connection regions which are connected to an electric connection region on the surface of the semiconductor body by means of an electric connection which is provided on, and electrically insulated from, a side face of the semiconductor body that makes an angle with the surface, and the semiconductor body being attached to a lead frame and further electric connections being formed between connection conductors forming part of the lead frame and electric connection regions, characterized in that the electric connections are formed as a plurality of regularly spaced, parallel strip-shaped conductors, and the electric connection region for the supply connection is connected by means of two or more of said strip-shaped connectors to a further electric connection region which is directly connected to a connection conductor which forms part of the lead frame, while the other electric connection regions are directly connected, by means of the further electric connections, to connection conductors forming part of the lead frame.

In a first embodiment of a method in accordance with the invention, the strip-shaped conductors are formed by providing a mask over the semiconductor body, which mask covers the side faces thereof and is locally provided with slits, and after the mask has been provided, a conductive layer is deposited thereon.

In another modification, a large number of semiconductor bodies are formed so as to be integrated with each other, and holes are formed on the areas of the surface where the individual semiconductor bodies will be separated from each other, the walls of said holes being covered with a conductive layer, after which the individual semiconductor bodies are separated from each other, two strip-shaped conductors being formed from the conductive layer within each hole, one of said conductors being situated on a side face of a semiconductor body and the other being situated on a side face of a neighboring semiconductor body.

These and other aspects of the invention are apparent from and will be elucidated with reference to the embodiment(s) described hereinafter.

In the drawings.

The figures are not drawn to scale and some dimensions, such as dimensions in the thickness direction, are exaggerated for clarity. Corresponding regions or parts in the different figures are indicated by means of the same reference numerals whenever possible.

Figure 1:
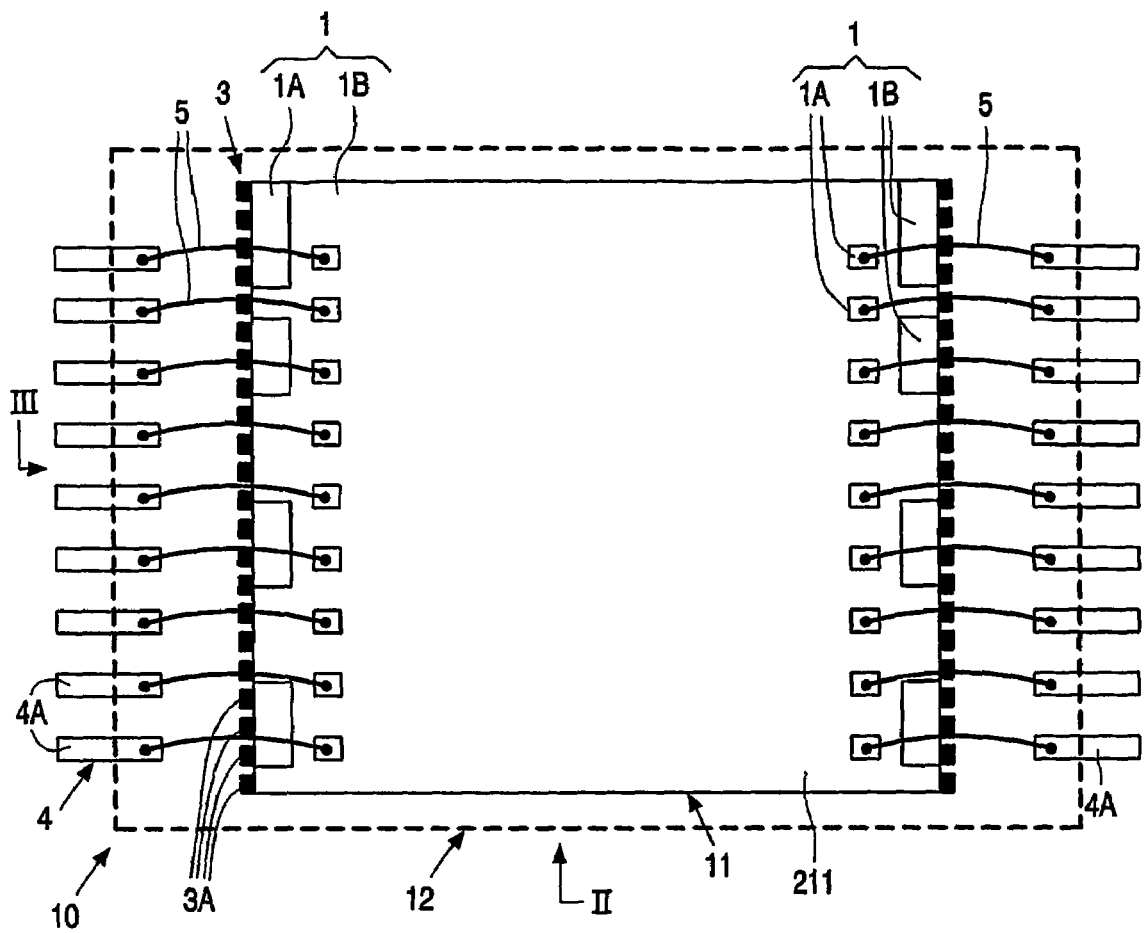
FIG. 1 is a diagrammatic, plan view of an embodiment of a semiconductor device in accordance with the invention.
Figure 2:
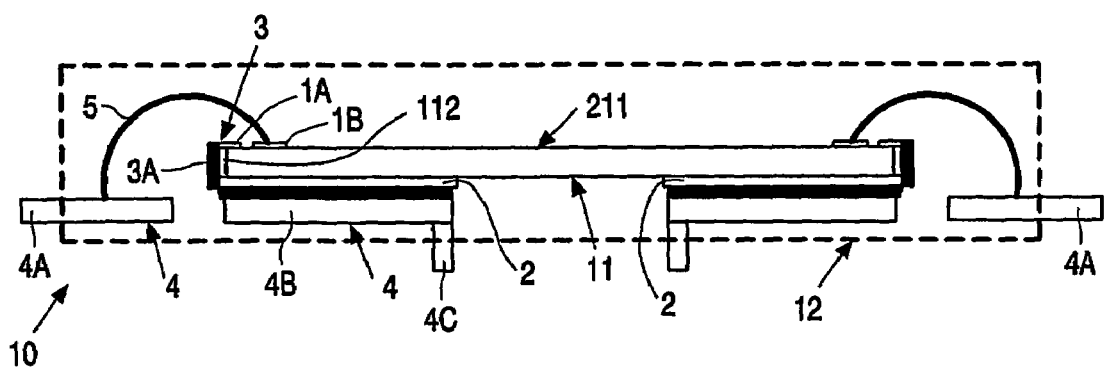
FIG. 2 is a diagrammatic, side view, from a direction indicated by means of II, of the device shown in FIG. 1
Figure 3:
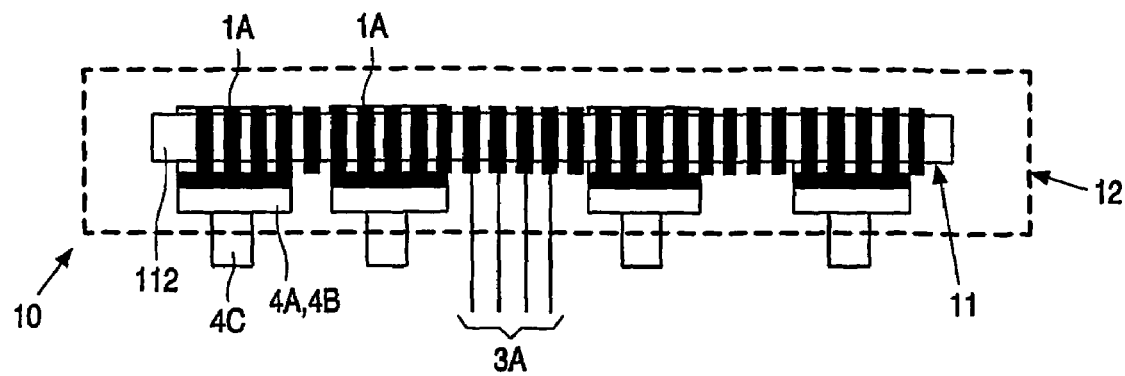
FIG. 3 is a diagrammatic, side view, from a direction indicated by means of III, of the device shown in FIG. 1.

FIG. 1 is a diagrammatic plan view of an embodiment of a semiconductor device in accordance with the invention, and FIG. 2 and FIG. 3 are diagrammatic side views of the device of FIG. 1 from the directions indicated by means of, respectively, II and III in FIG. 1. The semiconductor device 10 comprises a semiconductor body 11 with a substrate, in this case of silicon, and a semiconductor region, in this case of silicon, which rests on the substrate, which semiconductor body accommodates a plurality of semiconductor elements in the form of an integrated circuit, and the surface 211 of which is provided with a number of electric connection regions 1 for the integrated circuit, including at least two 1A for a supply connection. A side of the semiconductor body 11 which is situated opposite the surface 211 is provided with a number of further electric connection regions 2, which are isolated from the substrate by means of a silicon dioxide layer, and which are connected to an electric connection region 1 on the surface of the semiconductor body 11 by means of an electric connection 3 which is situated on a side face of the semiconductor body 11 that extends substantially perpendicularly to the surface 211 and electrically insulated therefrom, in this case by an insulating layer 112 of silicon dioxide. The semiconductor body 11 is attached, in this case by means of soldering, to a lead frame 4, and further electric connections 5 are formed between connection conductors 4A forming part of the lead frame 4 and electric connection regions 1.

In accordance with the invention, the electric connection 3 comprises a plurality of regularly spaced, parallel strip-shaped conductors 3A, and each electric connection region 1A for the supply connection is connected by means of two or more of said strip-shaped conductors 3A to a further electric connection region 2 which is connected directly to a connection conductor 4B which forms part of the lead frame 4, while the other electric connection regions 1B are directly connected by means of the further electric connections 5, in this case wire connections 5, to connection conductors 4A which form part of the lead frame 4. This offers a large number of advantages, in particular if the IC comprises very many semiconductor elements and accordingly the frame 4 comprises a very large number, for example several hundred, of connection conductors 4A, 4B. The most important advantages are: a stable supply voltage and excellent high-frequency behavior even at a low(er) supply voltage and at very high supply currents. In addition, the "zebra-like" pattern of strip-shaped conductors 3A offers, on the one hand, great freedom of design as regards (the position) of the connection regions. On the other hand, by virtue of this pattern 3, it is precluded that the mechanical stress in the electric connection 3 caused by the high currents passing through it and the associated heat dissipation can assume excessively high values.

In this example, the device 10 comprises a large number of electric connection regions 1A for a supply connection, which each provide a part of the integrated circuit with a supply connection and are situated at the edge of the surface of the semiconductor body 11 and are each connected to an individual, further electric connection region 2 by means of a plurality of the strip-shaped conductors 3A. The electric connection regions 1A for a supply connection are preferably elongated, like in this case, and the longest side extends parallel to a side face of the semiconductor body 11. In this example, the strip-shaped conductors 3A have a width of approximately 10 µm, and the spacing between them is also approximately 10 µm. This means that a side face of an IC having a surface area of 1 $cm^2$ accommodates approximately 10,000/20=500 strip-shaped conductors 3A. It is noted that, contrary to what the Figures suggest, also 1, 3 or 4 side faces of the semiconductor body 11 may be provided with a zebra pattern of strip-shaped conductors 3A.

In this example, the electrically and mechanically most vulnerable part of the device 10 is encapsulated by a synthetic resin encapsulation 12, in this case of an epoxy material, from which laterally project the connection conductors 4A of the lead frame 4 which are provided with a wire connection 5, and the further electric connection regions 2 are electrically accessible at the lower side of said encapsulation. In this example, the further connection regions 2 are accessible by virtue of the fact that they are connected, via connection conductors 4B, to pins 4C projecting from the encapsulation 12. Also the conductors 4A, represented as being flat in the Figures, may be deflected downward. By virtue thereof, the device 10 of this example can suitably be used for final mounting on a PCB.

Figure 4:
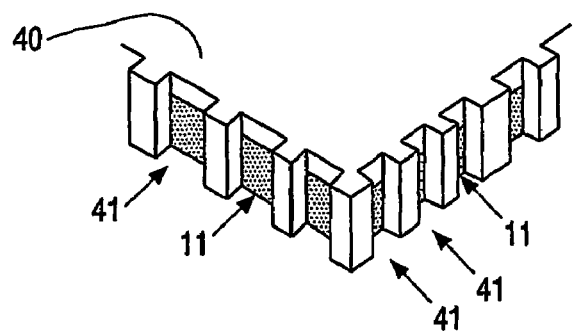
FIG. 4 shows the device of FIG. 1 in a stage of the manufacture by means of a method in accordance with the invention.

FIG. 4 shows the device of FIG. 1 in a stage of the manufacture by means of a method in accordance with the invention. After the IC has been formed in the semiconductor body 11 and the upper side thereof has been provided with the desired pattern of connection regions 1A, 1B and the lower side with the desired pattern of further connections regions 2, a mask 40 is placed over the semiconductor body 11, which mask is made, for example, of metal. This mask covers the upper side of the semiconductor body 11 and also part of the side faces thereof. The side faces of the mask 40 are provided with slit-shaped apertures 41. Next, after the assembly has been placed in a vapor deposition or sputtering device, a conductive layer, for example of aluminum, is vapor deposited or sputtered. In the apertures 41, the strip-shaped conductors 3A connecting the electric connection regions 1 to the further connection regions 2 are thus formed. If necessary, a small part of the slit-shaped apertures 41 may extend in slit-shaped recesses in the upper side of the mask 40. This enables a connection between the strip-shaped conductors 3A and the connection regions 1A near the upper edge of the semiconductor body 11 to be more readily established. Such a plate-shaped mask provided with recesses can also be arranged on the lower side, after inversion of the semiconductor body 11, thus enabling better electric contact to be achieved in a similar manner between the further connection regions 2 and the strip shaped conductors 3A. After this, the mask 40 is removed again and the semiconductor body 11 (see FIG. 1) is mounted on a frame 4, for example by means of soldering. After the provision of the wire connections 5 and an encapsulation 12, the device 10 is ready for final assembly/use.

Figure 5:
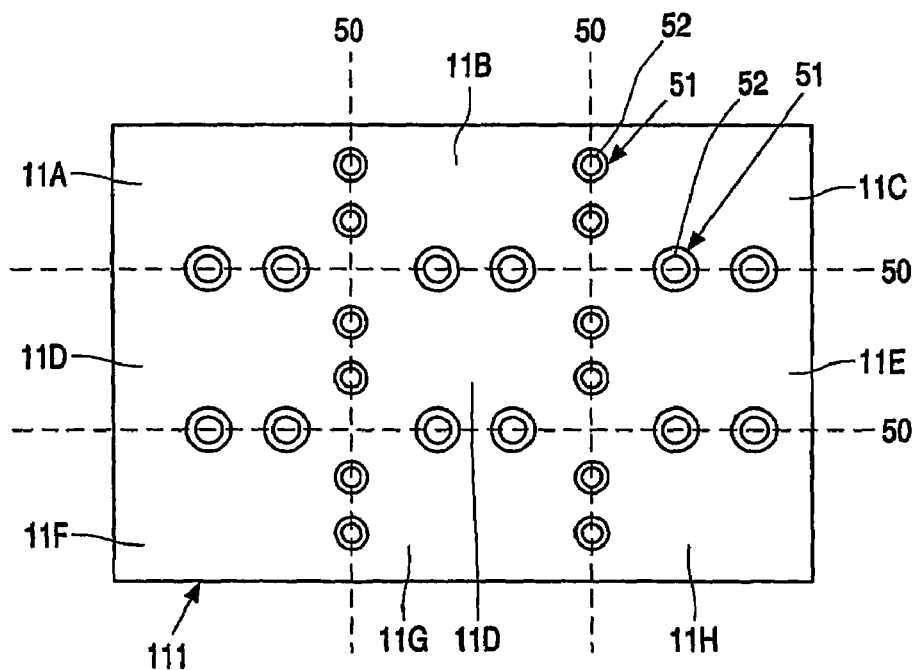
FIG. 5 shows the device of FIG. 1 in a stage of the manufacture by means of another embodiment of a method in accordance with the invention.

FIG. 5 shows the device of FIG. 1 in a stage of the manufacture by means of another embodiment of a method in accordance with the invention. In the stage where a single semiconductor body 111 still accommodates a large number of semiconductor bodies 11, the surface of the semiconductor body 111 is covered with a mask layer, not shown. FIG. 5 shows only 9 semiconductor bodies 11A . . . 11H. At the locations 50 where these semiconductor bodies 11A . . . 11H will ultimately be separated from each other, apertures 51 are formed in the mask layer by means of photolithography and etching. Next, by means of etching at the location of the apertures 51, holes 51 are formed in the semiconductor body 111. Subsequently, for example by means of vapor deposition, a conductive layer 52 is provided in holes 51, thus causing the walls thereof to be covered with the conductive layer 52. Next, the mask layer is removed again and, due to the so-termed lift-off, also the parts of the conductive layer 52 which landed on said mask layer are removed. If the individual semiconductor bodies 11A . . . 11H are ultimately separated from each other by means of a separation technique such as sawing, the conductive layer 52 in each hole 51 is divided into two parts which each form a strip-shaped conductor 3A on the side face of two neighboring semiconductor bodies 11D, 11E, etc. Further processing then takes place, for example, in the same manner as indicated in the discussion of FIG. 4.

The invention is not limited to the example described above, and within the scope of the invention many variations and modifications are possible to those skilled in the art. For example, devices having a different geometry and/or different dimensions may be manufactured. It is noted in particular that for the further electric connections that directly connect the signals from and to the IC with the conductors of the lead frame, use can be made not only of wire connections but also of so-termed bumps and an associated surface mounting technique. In said case, a part of the lead frame must be situated above the surface of the semiconductor body. This can be achieved by using a lead frame that is not lying in one plane. Also the use of two separate lead frames, one for the upper side and one for the lower side of the semiconductor body, is possible.

Regarding the lead frame, it is observed that this may also refer to any electrically insulating carrier with connection conductors. Such a carrier may contain a polymeric or ceramic dielectric material as known in the art, but alternatively a semiconductor substrate. The latter embodiment makes up a stacked die arrangement. However, a conventional lead frame is preferred for reason of cost.

Also regarding the manufacture numerous variations are possible. For example, for providing the strip-shaped conductors on the side face of the semiconductor body use can alternatively be made of so-termed 3-D photolithography, in which case, parts of a conductive layer situated between strip-shaped conductors to be formed are removed by means of photolithography and etching. Said intermediate parts can alternatively be removed by locally removing parts of a conductive layer by means of a laser beam. Such a technique can also be used for separating semiconductor bodies, for example instead of sawing.

Finally, it is noted that the semiconductor body may comprise a semiconductor substrate. If so, the further connection regions are electrically insulated therefrom by means of an insulating layer. If necessary one or more of the further connection regions may be connected to the substrate via openings in said layer. If the semiconductor body is provided on an insulating substrate, as in the case of the so-termed substrate transfer technique, said layer can be dispensed with, of course. The side face of the semiconductor body on which the strip-shaped conductor tracks are present must of course still be provided with an insulation. This can be achieved by providing an insulating layer on the side face. Since in this case the semiconductor body itself is comparatively thin, the side face can also be insulated by means of thermal oxidation from the surface of the semiconductor body.

The invention claimed is:

1. A semiconductor device comprising a semiconductor body having a substrate and a semiconductor region, the semiconductor body accommodates a plurality of semiconductor elements in the form of an integrated circuit, and a surface of the semiconductor body is provided with a number of electric connections for the integrated circuit, including at least two for a supply connection, a side of the semiconductor body situated opposite the surface being provided with a number of further electric connection regions which are connected to an electric connection region on the surface of the semiconductor body with an electric connection, the electric connection situated on, and electrically insulated from, a side face of the semiconductor body that makes an angle with the surface, and the semiconductor body being attached to a lead frame and further electric connections being formed between connection conductors forming part of the lead frame and electric connection regions, characterized in that the electric connection comprises a plurality of regularly spaced, parallel strip-shaped conductors, and the electric connection regions for the supply connection are each connected by two or more of said strip-shaped conductors to a further electric connection region, the further electric connection region directly connected to a connection conductor forming part of the lead frame, while the other electric connection regions are directly connected, by the further electric connections, to connection conductors forming part of the lead frame.

2. A semiconductor device (10) as claimed in claim 1, characterized in that the semiconductor device comprises a large number of electric connection regions for a supply connection, each of the large number of electric connection regions supplies a part of a supply current to the integrated circuit, and the large number of electric connection regions are situated at the edge of the surface of the semiconductor body and are each connected, by a plurality of said strip-shaped conductors, to an individual further electric connection region.

3. A semiconductor device as claimed in claim 2, characterized in that the electric connection regions for a supply connection are elongated, the longest side extending parallel to and bordering on a side face of the semiconductor body.

4. A semiconductor device as claimed in claim 1, characterized in that the strip-shaped conductors have a width in the range between 10 and 100 μm and are situated at a distance from each other in the range between 1 and 100 μm.

5. A semiconductor device as claimed in claim 1, characterized in that the semiconductor body is encapsulated by a synthetic resin encapsulation from which laterally project the connection conductors of the lead frame which are provided with a wire connection, and on the lower side of which the further electric connection regions are electrically accessible.

6. A semiconductor device as claimed in claim 1, characterized in that the further electric connections are wire connections.

7. A semiconductor body suitable for use in a semiconductor device as claimed in claim 1, and the semiconductor body has a substrate and a semiconductor region, the semiconductor body accommodates a plurality of semiconductor elements in the form of an integrated circuit, and a surface of the semiconductor body is provided with a number of electric connection regions for the integrated circuit, including at least one for a supply connection, a side of the semiconductor body situated opposite the surface being provided with a number of further electric connection regions which, the number of further electric connection regions are connected to an electric connection region on the surface of the semiconductor body by an electric connection, the electric connection is situated on, and electrically insulated from, a side face of the semiconductor body that makes an angle with the surface, characterized in that the electric connection comprises a plurality of regularly spaced, parallel strip-shaped conductors, and the number of electric connection regions for the supply connection are each connected by means of two or more of said strip-shaped connectors to a further electric connection region.

8. A semiconductor body as claimed in claim 7, characterized in that the semiconductor body comprises a large number of electric connection regions for a supply connection, which each of the large number of electric connection regions provide a part of the integrated circuit with a supply current, the large number of electric connection regions are situated at the edge of the surface of the semiconductor body and the large number of electric connection regions are each connected, by means of a plurality of said strip-shaped conductors, to a separate further connection region.

9. A semiconductor body as claimed in claim 8, characterized in that the electric connection regions for a supply connection are elongated, the longest side extending parallel to and bordering directly on a side face of the semiconductor body.

10. A semiconductor body, as claimed in claim 7, characterized in that the strip-shaped conductors have a width between 10 and 100 µm and are situated at a distance from each other in the range between 1 and 100 µm.

11. A method of manufacturing a semiconductor device comprising a semiconductor body having a substrate and a semiconductor region, the semiconductor body accommodates a plurality of semiconductor elements in the form of an integrated circuit, and
- a surface of the semiconductor body is provided with a number of electric connection regions for the integrated circuit, including at least one for a supply connection,
- a side of the semiconductor body situated opposite the surface being provided with a number of further electric connection regions the further electric connection regions are connected to an electric connection region on the surface of the semiconductor body by an electric connection provided on, and electrically insulated from, a side face of the semiconductor body that makes an angle with the surface,
- and the semiconductor body being attached to a lead frame and
- further electric connections being formed between connection conductors forming part of the lead frame and electric connection regions, characterized in that the electric connections are formed as a plurality of regularly spaced, parallel strip-shaped conductors, and
- the electric connection regions for the supply connection are each connected by two or more of said strip-shaped conductors to a further electric connection region, the further electric connection region directly connected to a connection conductor which forms part of the lead frame,
- while the other electric connection regions are directly connected, to the further electric connections, and to connection conductors forming part of the lead frame.

12. A method as claimed in claim 11, characterized in that the strip-shaped conductors are formed by
- providing a mask over the semiconductor body, the mask covers the side faces thereof and is provided in situ with slits, and,
- after the mask has been provided, a conductive layer is deposited thereon.

13. A method as claimed in claim 11, characterized in that
- a large number of semiconductor bodies are formed so as to be integrated with each other, and
- holes are formed on the areas of the surface where the individual semiconductor bodies will be separated from each other, the walls of said holes being covered with a conductive layer
- after the walls of said holes are covered with the conductive layer, the individual semiconductor bodies are separated from each other, two conductors being formed from the conductive layer within each hole, one of said conductors being situated on a side face of a semiconductor body and the other being situated on a side face of a neighboring semiconductor body.

* * * * *